United States Patent [19]
Ichihara

[11] Patent Number: 6,133,052
[45] Date of Patent: Oct. 17, 2000

[54] BUMP INSPECTION METHOD

[75] Inventor: Masaru Ichihara, Kadoma, Japan

[73] Assignee: Matsushita Electric Industrial Co., Ltd., Osaka, Japan

[21] Appl. No.: 09/027,341

[22] Filed: Feb. 20, 1998

[30] Foreign Application Priority Data

Feb. 24, 1997 [JP] Japan .................................. 9-038999

[51] Int. Cl.$^7$ ........................... H01L 21/00; H01L 21/66; G01R 31/26
[52] U.S. Cl. ................................. 438/7; 438/16
[58] Field of Search .................. 438/16, 7; 257/737, 257/738, 780, 781

[56] References Cited

U.S. PATENT DOCUMENTS

| 5,058,178 | 10/1991 | Ray | 382/150 |
| 5,306,664 | 4/1994 | Sakura | 29/827 |
| 5,761,337 | 6/1998 | Nishimura et al. | 382/150 |

FOREIGN PATENT DOCUMENTS 4-56246  2/1992  Japan .

*Primary Examiner*—Brian Dutton
*Attorney, Agent, or Firm*—Jordan and Hamburg LLP

[57] ABSTRACT

A measurement window 29 is set in a bump formation position found from the bump formation co-ordinates of bonding data in respect of an image that has been picked up of the external appearance of a stud bump 23 at an inspection position. The image in this measurement window 29 is converted to respective binary images based on binary conversion levels which are respectively individually set for measurement of bump pedestal 24 and for bump head 27. Of image grains constituted by continuous areas of the same image level in the binary image, an image grain having maximum area is extracted and the position, shape and dimensions of the bump pedestal 24 and bump head 27 are then respectively measured using respectively a hole-filled image and the hole portion of this extracted image grain. The quality and presence of a stud bump 23 are determined by comparing the measured values with set values.

19 Claims, 5 Drawing Sheets

BUMP INSPECTION METHOD

BACKGROUND OF THE INVENTION

In a flip-chip mounting method in which a semiconductor bare chip is directly mounted on a circuit board, the present invention relates to a method of bump inspection for performing two-dimensional inspection by image processing of the external appearance of stud bumps of a two-level projecting shape formed on the electrode pad of a semiconductor bare chip.

In recent years, miniaturisation and weight reduction of electronic devices is being demanded; concomitantly with this, with the object of raising electronic circuit mounting densities, the flip-chip mounting method has come to be widely employed, in which semiconductor bare chips obtained by dividing a wafer into individual chips are turned over and directly mounted on a circuit board. For example, the flip-chip mounting method is currently being used to manufacture CSPs (Chip Size Packages) which are packaged with the same dimensions as the semiconductor bare chip and also MCMs (Multichip Modules), in which a plurality of semiconductor bare chips are mounted on a circuit board, and production of these continues to increase.

In the SBB (Stud Bump Bonding) method, which is one type of flip-chip mounting method as described above, bumps are formed on the electrode pad of a semiconductor bare chip by applying the wire bonding method and leveling is performed by a leveling device so as to make the heights of the bump heads of these bumps uniform, thereby forming stud bumps of a two-level projecting shape having a bump pedestal and bump head. In order to ensure the required quality at the flip-chip joint in subsequent processing steps, it is indispensable to inspect the external appearance and shape of the stud bumps that are thus formed. In this external appearance inspection, it is demanded that not just the position, shape and dimensions of the bump pedestal be inspected but also that the position, shape and dimensions of the bump head, respectively, are within allowed values; a function for measuring the respective position, shape and dimensions of the bump pedestal and bump head is therefore demanded.

As a method of automatically inspecting the external appearance of stud bumps, there is already known a technique (see Early Japanese Patent Publication No. H.4-56246) of ascertaining the quality by image processing of a composite signal obtained by picking up an image of a stud bump on the electrode pad by using an inspection camera. The image processing device that is employed for this has functions such as measurement of the dimensions of stud bumps and obtaining the long side and short side of arbitrarily shaped circumscribed rectangles and is thereby capable of recognising when a bump is not formed on an electrode pad. Also, the measurement results are compared with numerical values that are set beforehand by means of a central processing unit, and the quality of the stud bump is assessed in accordance with the result of this comparison.

However, with the method of inspection of the external appearance of stud bumps by image processing as described above, various problems remain that need to be solved for practical implementation. First of all, in measuring the shape and/or dimensions of a subject stud bump by image processing, it is necessary to separate the stud bump and a pattern surface of the semiconductor bare chip that is its background, by converting the image to binary form; however, with the prior art image processing technique, there is a problem that it is difficult to determine a binary conversion level such that accurate separation can be achieved of the pattern surface of the semiconductor bare chip and the bump pedestal and between the bump pedestal and bump head, respectively.

For example, if the binary conversion level is set so as to suit measurement of the bump head, measurement precision in measurement of the bump pedestal is adversely affected. On the other hand, if the binary conversion level is set such as to suit measurement of the bump pedestal, measurement precision in measurement of the bump head is adversely affected. That is, using the prior art image processing technique, the bump pedestal and bump head cannot both be measured with high measurement accuracy. Also, if the binary conversion level is set so as to suit measurement of the bump head, precise measurement of the bump pedestal, may be made impossible by the effect of noise produced by probe scarring during chip examination and present on the electrode pad and/or outline of the electrode pad. In such cases, there is a high risk of oversensitive assessment in which good stud bumps are assessed as bad or of mis-assessment in which bad bumps are assessed as being good.

Also, in the case of stud bumps of a shape in which the outline of the bump head is adjacent to the outline of the bump pedestal, the margin for setting the binary conversion level becomes small, so if the binary conversion level is inappropriate, due to, for example, fluctuations of the illuminance on the semiconductor bare chip during image pick-up, on binary conversion, a binary image is obtained in which the bump head and the chip pattern surface are linked, making it impossible to measure the bump head. In such cases, oversensitive assessment in which good bumps are evaluated as being bad is likely and the reliability of the inspection is low.

Secondly, in the forming of stud bumps, pillar offset defects may occur in which the respective centers of gravity of the bump pedestal and bump head are offset due to buckling of the bonding wire, or standing-wire defects may occur in which the tip of the wire may become erect due to a joining defect or tearing defect in the second bonding step. Such semiconductor bare chips cause product defects due to short-circuiting between the electrodes when these are installed, so pillar offset defects or standing-wire defects must be detected and excluded. However, using the prior art image processing technique, since only a long side and a short side of the circumscribed rectangle of the stud bump are found and inspected, it is difficult to improve the detection rate of such pillar offset defects and/or standing-wire defects.

SUMMARY OF THE INVENTION

Accordingly, an object of the present invention is to provide a bump inspection method wherein the above problems of the prior art are solved and the quality of stud bumps can be accurately determined by reliable detection of defects such as mis-positioning, bad shape and bad dimensions of the bump pedestal and bump head of a stud bump.

In order to achieve the above object, a method of bump inspection according to the present invention comprises: a feed step in which a semiconductor bare chip formed with a stud bump of two-level projecting shape, having a bump pedestal and bump head, is located in a prescribed inspection position whilst being fed in a horizontal plane; an image pickup step of picking up an image of the external appearance of the stud bump at the inspection position; a measurement step of measuring the respective shape and dimensions of the bump pedestal and bump head by processing the image that has been picked up; and a determination step of determining the quality and the presence of the stud bump in accordance with whether or not the measured values in the measurement step are within respectively set values wherein, in the measurement step, a measurement window is set at a bump formation position found from the bump formation co-ordinates of bonding data with respect to the image that has been picked up, an image in this measurement window is converted to a binary image, and, of image grains constituted by continuous areas of a same image level in the binary image, an image grain having maximum area is extracted and the position, shape and dimensions of the bump pedestal are then measured using a hole-filled image of this extracted image grain, and the position, shape and dimensions of the bump head are measured using the hole portion of this extracted image grain.

With this method of bump inspection, of image grains forming continuous areas of the same image level in the binary image obtained by the conversion of the image in the measurement window to binary form, an image grain having maximum area is extracted and the respective position, shape and dimensions, for example the respective center position, degree of circularity, and diameter, of the bump pedestal and bump head are measured using, respectively, the hole-filled image and the hole portion of this image grain. Consequently, the bump pedestal and bump head are measured stably and concurrently and quality is ascertained by comparing the measured values with set values. Also, with this bump inspection method, the stud bump inspection process is automated by passing through a feed step, image pickup step, measurement step and determination step.

In the measurement step according to the present invention, it is desirable that, when converting the image in the measurement window to a binary image, respective individual binary conversion levels should be set for bump pedestal measurement and for bump head measurement.

In this way, by setting binary conversion levels individually suited for measurement of the bump pedestal and bump head respectively, conversion to respective binary images is effected using the binary conversion levels. As a result, binary images are obtained in which the electrode pad of the semiconductor bare chip and the bump pedestal, and the bump pedestal and bump head are respectively accurately distinguished, so the bump pedestal and bump head are respectively accurately measured. Furthermore, in the measurement of the bump pedestal, since a binary image is used which is obtained by conversion with a binary conversion level appropriate for this measurement, the effects of the outline portion of the electrode pad of the semiconductor bare chip and/or of probe scars during chip inspection etc. such as were previously experienced are eliminated.

Preferably in the measurement step according to the present invention, if the measured value of the bump head is zero so that its measurement is impossible, the image in the measurement window is successively subjected to binary conversion at different binary conversion levels and whilst this is done a determination is made as to whether or not measurement of the bump head is possible from the binary images obtained by these binary conversions. When the measurement becomes possible, bump head measurement is performed using the binary image. In the determination step, if, even though binary conversion has been performed a prescribed number of times, bump head measurement is still impossible, or if the measured values of the bump head exceed set values, the stud bump is deemed to be bad.

In this way, stable measurement of the bump head is achieved even if, in a binary image of a stud bump of a shape in which the outline of the bump head is adjacent the outline of the bump pedestal, the bump head and the electrode pad are in linked condition, so the quality of the stud bump is accurately determined. Consequently, oversensitive determination in which good products were deemed defective due to inability to measure the bump head, such as occurred conventionally, is reliably prevented.

Preferably, in the measurement step according to the present invention, the respective centers of gravity of the bump pedestal and bump head are found using respective measured values of shape and dimensions etc. of the bump pedestal and bump head and, in the determination step, after calculation of the amount of offset of the two centers of gravity, a determination is made of the quality of the stud bump in accordance with whether or not this amount of offset is within an allowed value.

In this way, in regard to a stud bump in which a pillar offset defect has occurred, the amount of offset of the center of gravity of the bump pedestal and the center of gravity of the bump head is measured, in contrast with the prior art, in which inspection was performed by finding the long side and short side of the circumscribed rectangle of the stud bump, and pillar offset defects are detected by reference to the magnitude of this offset; the rate of detection of pillar offset defects can thereby be considerably improved. As a result, defective products due to short-circuiting between the electrodes on mounting of the semiconductor bare chip are practically eliminated.

Preferably, in the measurement step according to the present invention, a circumscribed diameter corresponding to the length of a side of a circumscribed rectangle of the stud bump in the binary image obtained by converting the image in the measurement window to binary form and a central diameter corresponding to the external dimension on a center-line of the stud bump in the binary image are measured and, in the determination step, the difference of the circumscribed diameter and the central diameter is found, and the quality of the stud bump is determined in accordance with whether or not this difference is within an allowed value.

In this way, in regard to a stud bump in which a standing-wire defect has occurred, the circumscribed diameter of the circumscribed rectangle of the stud bump and the central diameter on the center-line of the stud bump are measured, in contrast to the prior art, in which inspection was performed by finding the long side and short side of the circumscribed rectangle of the stud bump, and standing-wire defects are detected by reference to the magnitude of the difference of this circumscribed diameter and central diameter; the rate of detection of standing-wire defects can thereby be considerably improved. As a result, defective products due to short-circuiting between the electrodes on mounting of the semiconductor bare chip are practically eliminated.

DESCRIPTION OF THE PREFERRED EMBODIMENTS

Preferred embodiments of the present invention are described below with reference to the drawings.

Figure 1:
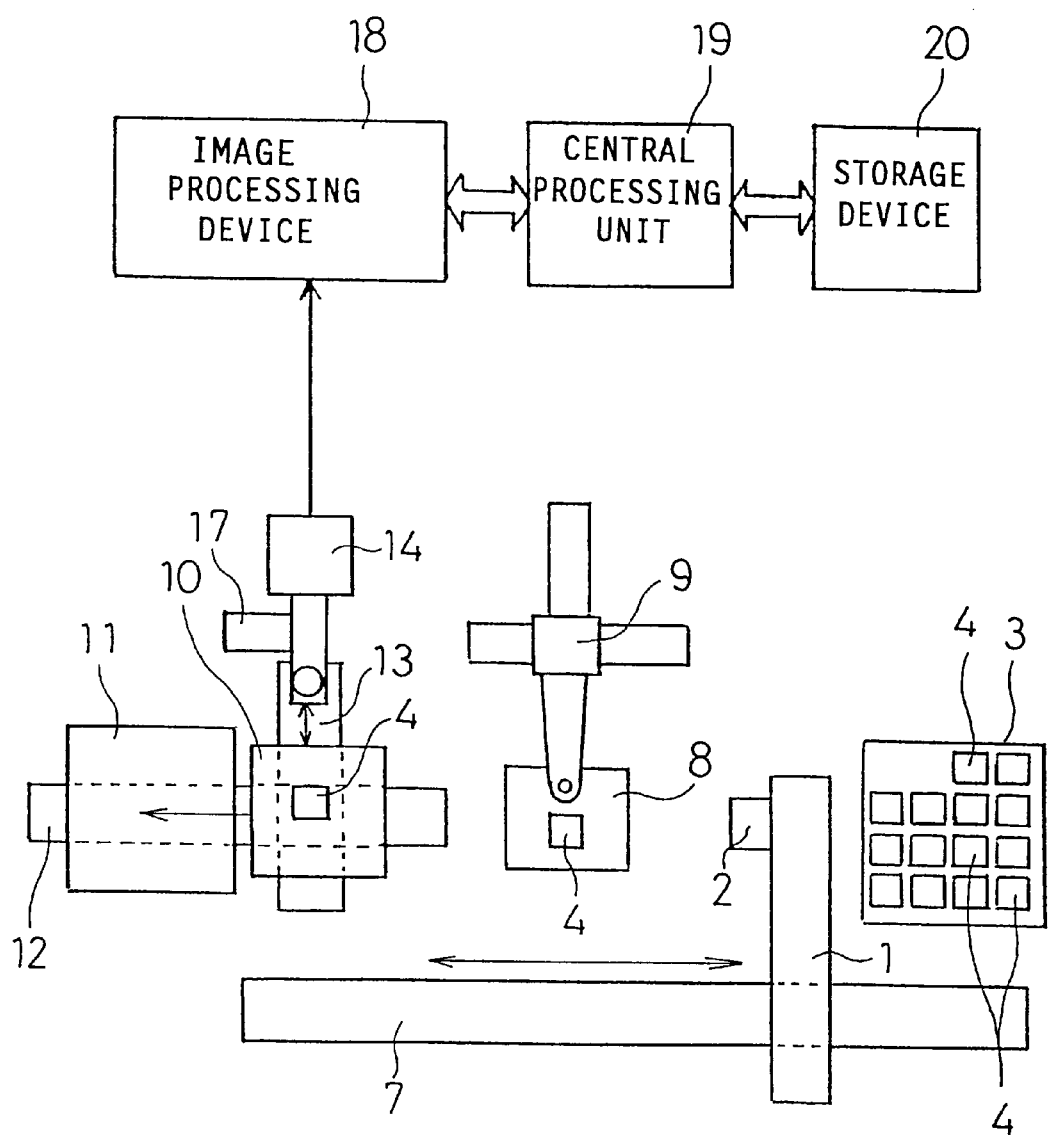
FIG. 1 is a diagrammatic plan view showing a bump inspection device according to an embodiment of a bump inspection method according to the present invention.

FIG. 1 is a diagrammatic plan view illustrating a bump inspection device according to an embodiment implementing a bump inspection method according to the present invention. The bump inspection device is employed incorporated in bump bonder equipment. The bump bonder incorporating the bump inspection device forms bumps on a semiconductor bare chip 4, performs leveling of the thus-formed bumps and is provided with a function whereby all the bumps are subsequently fully automatically inspected.

In the bump bonder, prior to commencement of production, information such as the forming co-ordinates of the stud bumps with respect to the semiconductor bare chip 4 are registered in a storage device 20 as bonding data. Also, with the object of inspecting all the stud bumps with as little movement as possible of the field of view of an inspection camera 14, an inspection screen position is calculated beforehand whereby as many stud bumps as possible are included in the field of view of a single inspection camera 14, and this calculated position information is registered in the storage device. The central processing unit 19 of the bump bonder executes overall control as described below in accordance with a control program and various data that are set and stored in storage device 20.

A start key (not shown) of the bump forming equipment is pressed to initiate movement of a feed arm 1 along feed guide 7 towards tray 3, and a pickup section 2 of the feed arm 1 picks up a prescribed one of a plurality of semiconductor bare chips 4 accommodated in tray 3. Next, feed arm 1 moves along feed guide 7 in the direction away from tray 3 so as to move a semiconductor bare chip 4 to a bonding stage 8 and sets semiconductor bare chip 4 in a prescribed position of bonding stage 8. A bump is then formed on semiconductor bare chip 4 by the action of bonding head 9 at a position on an electrode pad based on the bump formation co-ordinates of the bonding data.

After the semiconductor bare chip 4 the bump formed thereon has been once again picked up by pick-up section 2, it is moved by movement of feed arm 1 to leveling stage 10 and set in a prescribed position on leveling stage 10. Next, leveling stage 10, on which semiconductor bare chip 4 is placed, is shifted in the direction of the arrow along first movement guide device 12 and is located in position and stopped underneath leveling device 11. Next, leveling to a prescribed height is performed by crushing heads of the bumps by lowering leveling device 11. Two-level projecting shape stud bumps are thereby formed on the electrode pad of semiconductor bare chip 4.

The semiconductor bare chip 4 with the stud bumps formed thereon, remaining on leveling stage 10, is moved in the opposite direction to the arrow the first movement guide device 12 and then along a second movement guide device 13 at right angles to the first movement guide device 12 and is arrested and located at an inspection screen position, found from the bump formation co-ordinates of the bonding data, below inspection camera 14. In this condition, an image of the pad electrode formed with the stud bumps on semiconductor bare chip 4 is picked up by means of an inspection camera 14 with the pad illuminated from directly above by illuminating light from an overhead illuminating device 17 with a luminance appropriate for the inspection. The image signal of inspection camera 14 is input to an image processing device 18 where measurement of the stud bumps and inspection based on the results of the measurement are performed by carrying out image processing as described below.

Figure 2:
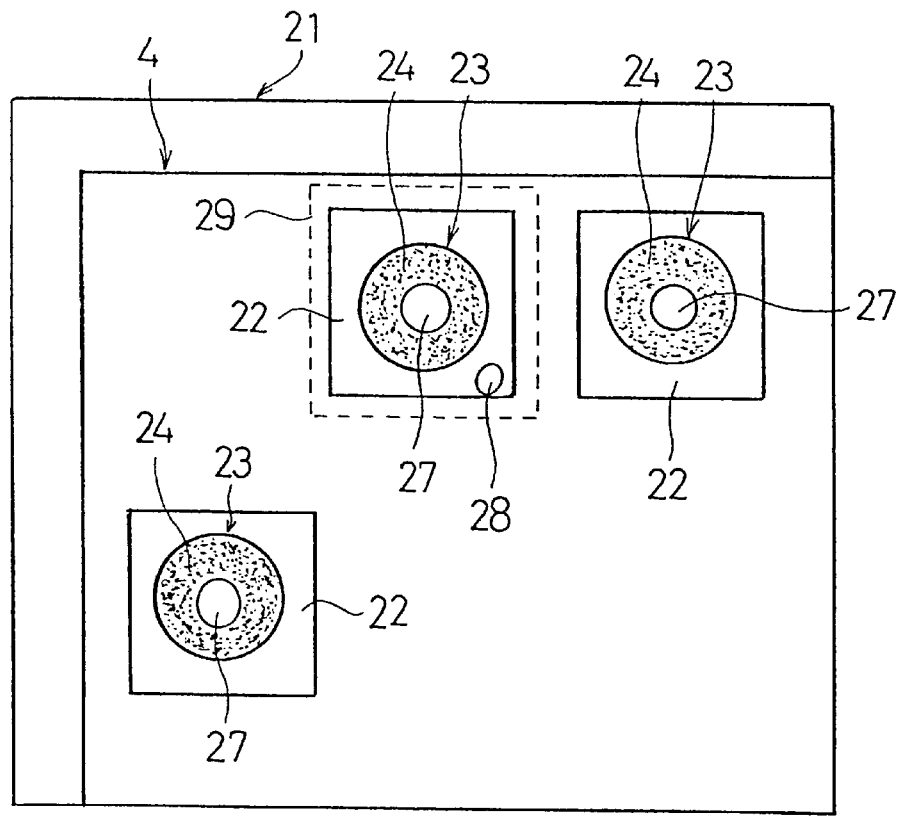
FIG. 2 is a diagram of a processed image obtained from an image signal that is input to an image processing device in the above device.

FIG. 2 is a view showing diagrammatically a processed image 21 obtained by processing the image signal that is input from inspection camera 14 by image processing device 18. The processed image 21 shows up semiconductor bare chip 4, a plurality of electrode pads 22 on the semiconductor bare chip 4, and bump pedestal 24 and bump head 27 of stud bumps 23 formed on each electrode pad 22. Additionally, as shown in the drawing, noise 28 may be present, caused by probe scars produced during chip inspection.

However, since, with such a bump bonder, semiconductor bare chip 4 is illuminated from directly above by means of overhead illumination device 17, electrode pads 22 and bump heads 27, which are comparatively flat, appear in the image as white areas since they reflect the light directly back in the illumination direction, while the bump pedestals 24, which constitute inclined surfaces, appear as dark areas, since they scatter the light. The outlines of electrode pads 22, bump pedestals 24 and bump heads 27 respectively are therefore well defined in the image that is picked up.

It should be noted that, with the bump bonder, there is prepared a semiconductor bare chip 4 of the same type as the subject of inspection and, by comparing the gradation image obtained by picking up an image of a stud bump 23 formed on the semiconductor bare chip 4 as a reference binary image, a first binary level suited to measurement of bump pedestal 24 and a second binary level suited to measurement of bump head 27 are found beforehand. These first and second binary levels are set in the image processing device 18.

Figures 3A, 3B:
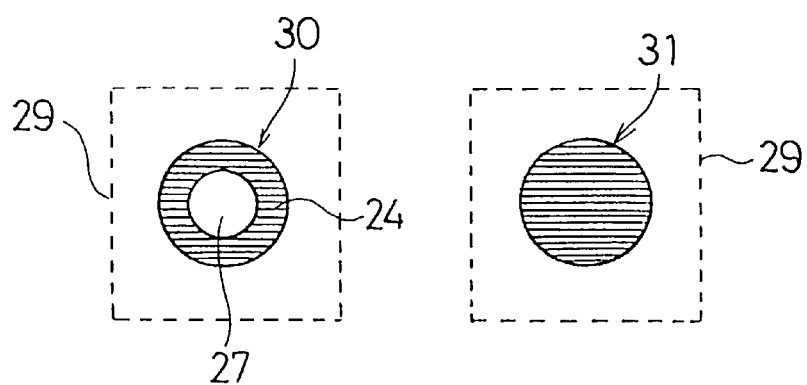
FIG. 3A and FIG. 3B are diagrams illustrating image processing when a bump pedestal is measured in the above embodiment.

In the image processing device 18, with respect to the aforementioned processed image 21, there is set a measurement window 29 at a the position of formation of a stud bump 23 found from the bump formation co-ordinates of the bonding data. Next, the image in the measurement window 29 is converted to binary form with the first binary level that is set beforehand for measurement of bump pedestal 24 and is converted into a binary image 30 for pedestal measurement as shown in FIG. 3A. Images of the electrode pads 22 and bump heads 27 that appear only at the second binary conversion level are not present in this binary image 30 for pedestal measurement. Further, of image grains forming continuous areas of the same image level in binary image 30 for pedestal measurement, an image grain having maximum area is extracted and this extracted image is then subjected to hole-filling processing by a well-known image processing method, to convert it to a hole-filled image 31 for pedestal measurement, as shown in FIG. 3B. The center position, degree of circularity, diameter and area etc. in this hole-filled image 31 for pedestal measurement are then measured.

Figure 4A:
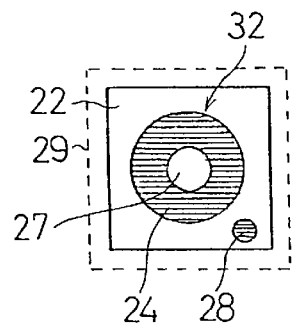
FIGS. 4A–4E are diagrams illustrating image processing when a bump head is measured in the above embodiment.
Figure 4B:
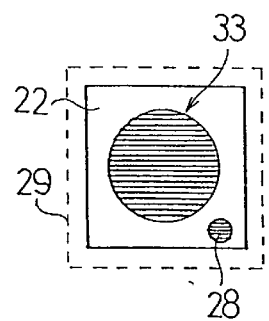
Figure 4C:
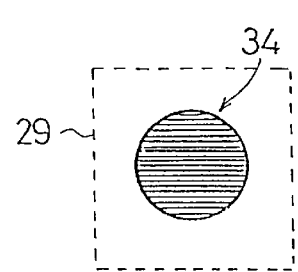
Figure 4D:
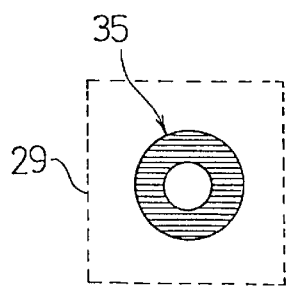
Figure 4E:
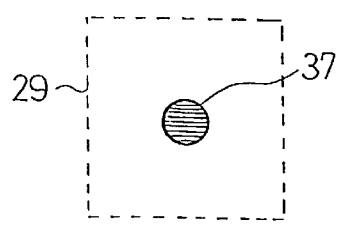

Then, the image in measurement window 29 is converted to binary form using the second binary conversion level that is set beforehand for measurement of bump heads 27, thereby being converted into binary image 32 for head measurement as shown in FIG. 4A. Further, this binary image 32 for head measurement is subjected to hole-filling processing by a well-known image processing method to convert it to a hole-filled image 33 for head measurement as shown in FIG. 4B. Next, as shown in FIG. 4C, of image grains forming continuous areas in the hole-filled image 33 for head measurement which are of the same image level, the image processing device 18 extracts an image grain having maximum area to find an extracted image 34. Further, the image processing device 18 performs processing to find the image of the product of extracted image 34 and binary image 32 of FIG. 4A for head measurement. In this way, as shown in FIG. 4D, a product image 35 is obtained from which the outline of electrode pad 22 and/or noise 28 have been removed. After this, a bump head image 37 as shown in FIG. 4E is obtained by extracting the hole from this product image. The image processing device 18 then performs measurement of the center position, degree of circularity, diameter and area etc. in the head image 37 which is thus found.

By this means, image processing device 18 effects binary conversion of the processed images of bump pedestal 24 and bump head 27 with mutually different first and second binary conversion levels that are respectively adapted thereto and can therefore measure with high accuracy the respective center position, circularity, diameter and area etc. of both bump pedestal 24 and bump head 27 and is able to detect whether or not a stud bump 23 is formed. Thus, accurate inspection can be achieved. Furthermore, in the measurement of bump pedestal 24, the effect of outline portions of electrode pad 22 and/or noise 28 due to, for example, probe scars on the electrode pad 22 on semiconductor bare chip 4 can be eliminated.

Next, central processing unit 19 finds the respective differences of the respective measured values of the bump pedestal 24 and bump head 27 described above, found by image processing device 18, from reference set values that are set and input beforehand in storage device 20 and determines whether or not these differences are within the allowed values that are set and input beforehand in storage device 20 and, if the allowed values are exceeded, determines that the inspected stud bump is bad.

Every time image pick-up of a stud bump 23 is completed, central processing unit 19 displaces inspection camera 14 in the horizontal plane and successively locates it in the inspection screen position found from the bump formation co-ordinates of the bonding data and also exercises control of inspection by means of the image processing described above with respect to stud bumps 23, This positioning is sequentially repeated until inspection of all the stud bumps 23 on semiconductor bare chip 4 has been performed. Furthermore, central processing unit 19, after the inspection of the semiconductor bare chip 4 has been completed, determines if there are no bad stud bumps 23, and deems the semiconductor bare chip 4 to be good and accommodates it in the original tray 3 or a special good chip tray. However, if even one bad stud bump 23 is present, the semiconductor bare chip 4 is deemed to be bad and control is effected to accommodate it in a bad chip tray. Central processing unit 19 therefore terminates the inspection of the semiconductor bare chip 4 once a bad stud bump 23 has been detected.

Figure 5A:
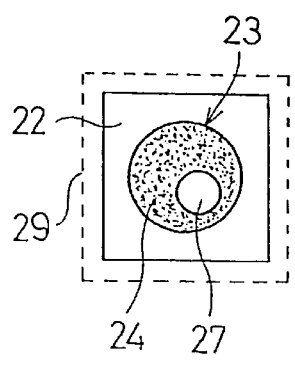
FIGS. 5A–5C are diagrams illustrating image processing when a stud bump having a shape wherein the outline of the bump head is adjacent the outline of the bump is measured in the above embodiment.
Figure 5B:
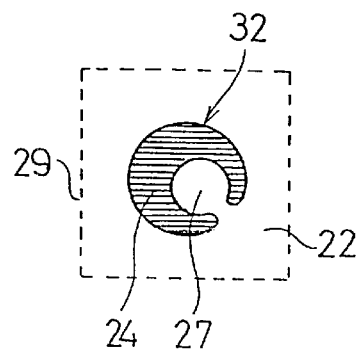

FIG. 5A is a view showing diagrammatically a processed image of a single stud bump 23 processed by image processing device 18. In this processed image, an example is shown of a case of a stud bump 23 in which the outline of a bump head 27 is adjacent the outline of a bump pedestal 24. In such a case, the margin for setting the binary conversion levels becomes small, so, if the illuminance of the overhead illuminating device 17 fluctuates or if the optical reflectivity of the semiconductor bare chip 4 is different, the second binary conversion level intended for measurement of bump head part 27 may inappropriate. As a result, as shown in FIG. 5B, in the binary image 32 for head measurement obtained by converting the processed image of FIG. 5A to binary form using the second binary conversion level, both electrode pad 22, constituting the pattern surface of the semiconductor bare chip 4, and bump head 27 are picked up as white colours and so appear in a linked condition. Thus, the outline of bump head 27 is not contained within the outline of bump pedestal 24. In such a case, conventionally, measurement of bump head 27 could not be performed and oversensitive determination occurred in which good stud bumps were evaluated as being bad.

Figure 5C:
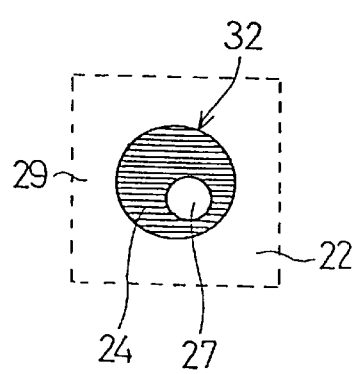

However, with the present invention, since the measurement area of bump head 27 obtained as a result of the measurement described with reference to FIG. 4 is "0", when this measured area is "0", it is concluded that the outline of bump head 27 is not contained within the outline of bump base 24, and so the following processing is continued. Specifically, central processing unit 19 continues monitoring of the binary image of bump head 27 obtained by the image processing performed by image processing device 18 whilst successively altering in predetermined steps the second binary conversion level that was previously adjusted for measurement of bump head 27. As shown in FIG. 5C, this processing is continued until a binary image 32 for head measurement is obtained in which the outline of bump head 27 is contained within the outline of bump pedestal 24. At the time-point where such a binary image 32 for head measurement has been obtained, measurement of bump head 27 can be performed without obstacle by conducting the image processing described with reference to FIG. 4. If central processing unit 19 is unable to obtain a binary image 32 for head measurement in which the outline of bump head 27 is contained within the outline of bump pedestal 24, in spite of altering the setting of the binary conversion level a prescribed number of times, the stud bump 23 is deemed to be bad.

Figure 6:
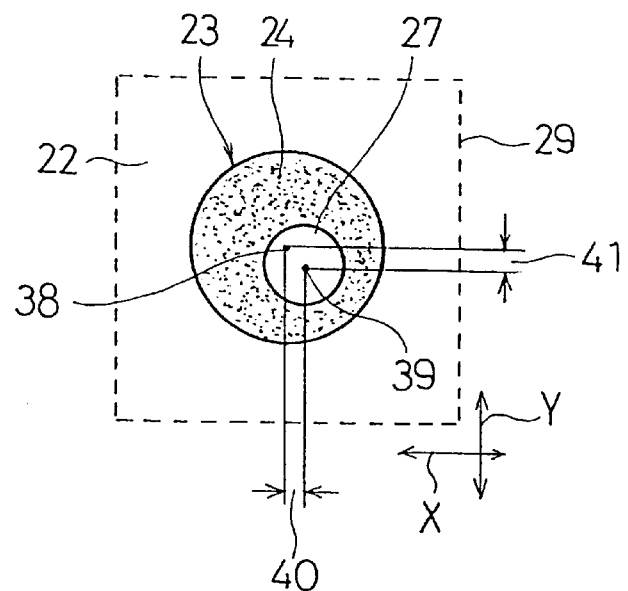
FIG. 6 is a diagram illustrating image processing when a stud bump having a pillar offset defect is measured in the above embodiment.

FIG. 6 is a view showing diagrammatically a processed image of a given single stud bump 23 in an image signal that is input to image processing device 18. The processed image 21 shows an example in which a pillar offset defect has occurred in which a center of gravity 38 of bump pedestal 24 and a center of gravity 39 of bump head 27 are offset, due to buckling of the bonding wire during forming of stud bump 23. In this case, central processor unit 19 finds by calculation the amount of offset 40 of the X direction and the amount of offset 41 of the Y direction of the center of gravity 38 of the bump pedestal and the center of gravity 27 of the bump head, based on the results of measurement such as center position, circularity, diameter and area respectively of bump pedestal 24 and bump head 27 measured in accordance with the image processing described with reference to FIG. 3 and FIG. 4 by image processing device 18. Further, central processing unit 19 determines whether or not the calculated offset amounts 40, 41 lie within the allowed pre-set values, and if they exceed the allowed values, the stud bump 23 is deemed to be bad.

As a result, pillar offset defects of stud bumps 23 can be detected in stable manner and the detection rate can thereby be considerably improved.

Figure 7A:
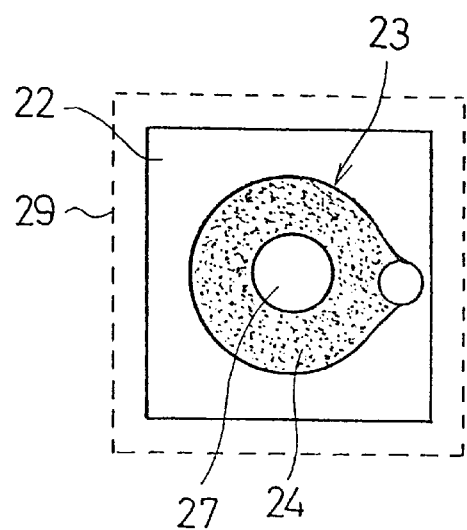
FIG. 7A and FIG. 7B are diagrams illustrating image processing when a stud bump having a standing-wire defect is measured in the above embodiment.

FIG. 7A is a view showing diagrammatically another processed image of a single stud bump 23 in an image signal that is input to image processing device 18. This processed image shows by way of example a case in which a standing-wire defect has occurred produced by the tip of the wire standing up due to a of joining or tearing defect during the second bonding step in the process of forming stud bump 23.

Figure 7B:
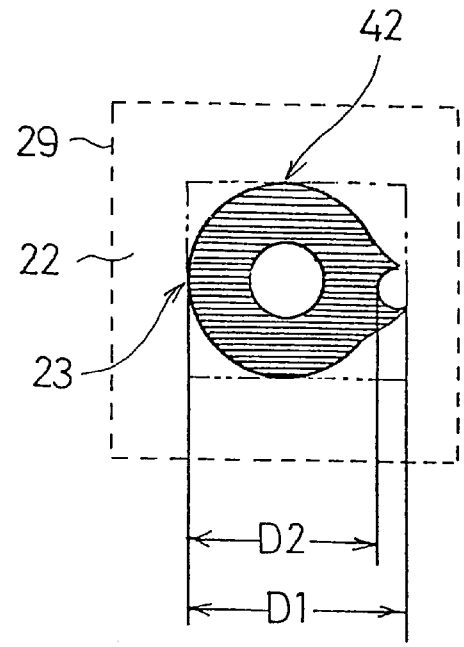

When a processed image as described above is converted to binary form with the second binary conversion level, a binary image 42 as shown in FIG. 7B is obtained. Image processing device 18 measures the circumscribed diameter D1 corresponding to the length of a side of the circumscribed rectangle shown by the double-dotted chain line of stud bump 23 of binary image 42 and the center diameter D2 corresponding to the external dimension on the center-line of stud bump 23 and inputs the measured value data to central processing unit 19. Central processing unit 19 calculates the value obtained by subtracting central diameter D2 from circumscribed diameter D1 and then determines whether or not this calculated value is within a pre-set allowed value and, if it exceeds the allowed value, the stud bump 23 is deemed to be bad. In this way, standing-wire defects of stud bumps 23 can be detected in stable manner and the detection rate can be considerably improved.

While a preferred embodiment of the invention has been described using specific terms, such description is for illustrative purposes only, and it is to be understood that changes and variations may be made without departing from the spirit or scope of the following claims.

What is claimed is:

1. A method of inspecting a stud bump having a bump pedestal and a bump head, comprising the steps of:

imaging an external appearance of the stud bump to produce image data;

converting the image data to bi-level image data of high and low level;

performing on said bi-level image data extraction of a continuous image grain area having image grain of like level and of maximum continuous area from said bi-level image data to produce continuous area data and hole filling a hole in to produce a filled area data representing a filled area and hole data representing the hole filled;

measuring the filled area to determine at least one pedestal dimension and pedestal position of the bump pedestal by processing said filled area data;

measuring said hole filled during said hole filling to determine at least one head dimension and head position of the bump head by processing said hole data representing the hole filled; and determining whether the at least one pedestal dimension, the pedestal position, the head dimension and head position are within respectively set value ranges and indicating the stud bump is defective when the determination is negative.

2. The method according to claim 1 wherein:

said converting the image data to bi-level image data includes converting the image data using a first threshold level for bump pedestal measurement and a second threshold level for bump head measurement such that said bi-level image data includes pedestal bi-level image data and head bi-level image data;

said extracting and said hole filling is performed on both said pedestal bi-level image data and said head bi-level image data;

said hole filled area data precessed during said measuring the hole filled area is derived from said pedestal bi-level image data;

said hole data processed during said measuring said hole filled is derived from said head bi-level image data.

3. The method according to claim 1 further comprising:

determining whether the measured value of the at least one head dimension is zero indicating a hole is not filled;

successively altering a binary conversion level used in said converting of the image and effecting said converting, said extraction, said hole filling and said measuring said hole filled until one of a non-zero value is obtained for said at least one head dimension and a predetermined number of alterations of said binary conversion level occurs;

using said non-zero value in said determination step when obtained; and indicating the stud bump is deemed to be defective when said predetermined number of alterations occurs.

4. A method of inspecting a stud bump having a bump pedestal and a bump head, comprising the steps of:

imaging an external appearance of the stud bump to produce image data;

converting the image data to bi-level image data of high and low level;

performing on said bi-level image data extraction of a continuous image grain area having image grain of like level and of maximum continuous area from said bi-level image data to produce continuous area data and hole filling a hole in to produce a filled area data representing a filled area and hole data representing the hole filled;

measuring the filled area to determine at least one pedestal dimension and pedestal position of the bump pedestal by processing said filled area data;

measuring said hole filled during said hole filling to determine at least one head dimension and head position of the bump head by processing said hole data representing the hole filled;

said measuring the filled area includes determining a center of gravity of the bump pedestal;

said measuring said hole filled includes determining a center of gravity of the bump head;

determining whether the at least one pedestal dimension, the pedestal position, the head dimension and head position are within respectively set value ranges and indicating the stud bump is defective when the determination is negative; and said determining step including determining an amount of offset of said center of gravity of said bump head from said center of gravity of said bump pedestal, determining whether the amount of offset is within an allowed range and indicating the stud bump is defective upon a negative determination with respect to the allowed range.

5. A method of inspecting a stud bump having a bump pedestal and a bump head, comprising the steps of:

imaging an external appearance of the stud bump to produce image data;

converting the image data to bi-level image data of high and low level;

performing on said bi-level image data extraction of a continuous image grain area having image grain of like level and of maximum continuous area from said bi-level image data to produce continuous area data and hole filling a hole in to produce a filled area data representing a filled area and hole data representing the hole filled;

measuring the filled area to determine at least one pedestal dimension and pedestal position of the bump pedestal by processing said filled area data;

measuring said hole filled during said hole filling to determine at least one head dimension and head position of the bump head by processing said hole data representing the hole filled;

measuring a circumscribed diameter corresponding to a length of a side of a rectangle circumscribing the continuous image grain area and a central diameter corresponding to an external dimension on a center-line of the continuous image grain area; and determining whether the at least one pedestal dimension, the pedestal position, the head dimension and head position are within respectively set value ranges and indicating the stud bump is defective when the determination is negative; and said determining step including determining a difference between the circumscribed diameter and the central diameter determining whether the difference is within an allowed range and indicating the stud bump is defective upon a negative determination with respect to the allowed range.

6. A method of inspecting a stud bump having a bump pedestal and a bump head, comprising the steps of:

imaging an external appearance of the stud bump to produce image data;

converting the image data by thresholding to produce first bi-level image data for bump pedestal measurements and second bi-level image data for bump head measurements;

processing said first bi-level image data including the steps of:

performing, on said first bi-level image data, extraction of a continuous image grain area having image grain of like level and of maximum continuous area from said first bi-level image data to produce first continuous area data absent noise data;

hole filling said first continuous area data to produce first hole-filled area data representing said first continuous area data which is hole-filled and representative of said bump pedestal; and processing said first hole-filled area data to determine at least one pedestal dimension of said bump pedestal;

processing said second bi-level image data including the steps of:

hole filling said second bi-level image data to produce second hole-filled area data;

performing, on said second hole-filled area data, extraction of a continuous image grain area having image grain of like level and of maximum continuous area from said second hole-filled area data to produce second continuous area data absent noise;

producing product image data which is a product of said second bi-level image data and said second continuous area data wherein said product image data represents an image of said bump head surrounded by said bump pedestal without extraneous noise;

extracting bump head image data from said product image data, said bump head image data being representative of an image of said bump head alone; and processing said bump head image data to determine at least one head dimension of said bump head; and determining whether the at least one pedestal dimension and the at least one head dimension are within respectively set value ranges and indicating the stud bump is defective when the determination is negative.

7. The method according to claim 6 wherein:

said converting the image data to produce said first bi-level image data includes converting the image data using a first threshold level for bump pedestal measurement; and said converting the image data to produce said second bi-level image data includes converting the image data using a second threshold level for bump head measurement.

8. The method according to claim 7 further comprising:

determining whether the measured value of the at least one head dimension is zero indicating a hole is not filled;

successively altering said second threshold level used in said converting of the image data to produce said second bi-level image data and effecting said processing of said second bi-level image data until one of a non-zero value is obtained for said at least one head dimension and a predetermined number of alterations of said second threshold level occurs;

using said non-zero value in said determination step when obtained; and indicating the stud bump is deemed to be defective when said predetermined number of alterations occurs.

9. The method according to claim 6 further comprising:

determining whether the measured value of the at least one head dimension is zero indicating a hole is not filled;

successively altering a binary conversion threshold level used in said converting of the image data to produce said second bi-level image data and effecting said processing of said second bi-level image data until one of a non-zero value is obtained for said at least one head dimension and a predetermined number of alterations of said binary conversion level occurs;

using said non-zero value in said determination step when obtained; and indicating the stud bump is deemed to be defective when said predetermined number of alterations occurs.

10. The method according to claim 6 further comprising:

said processing said first hole-filled area data includes determining a center of gravity of said bump pedestal;

said processing said bump head image data includes determining a center of gravity of said bump head;

determining an amount of offset of said center of gravity of said bump head from said center of gravity of said bump pedestal; and determining whether the amount of offset is within an allowed range and indicating the stud bump is defective upon a negative determination with respect to the allowed range.

11. The method according to claim 6 further comprising:

measuring a circumscribed diameter corresponding to a length of a side of a rectangle circumscribing an area represented by the first hole-filled area data and a central diameter corresponding to an external dimension on a center-line of the area represented by the first hole-filled area data;

determining a difference between the circumscribed diameter and the central diameter; and determining whether the difference is within an allowed range and indicating the stud bump is defective upon a negative determination with respect to the allowed range.

12. A method of inspecting a stud bump having a bump pedestal and a bump head, comprising the steps of:

imaging an external appearance of the stud bump to produce image data;

converting the image data by thresholding using a first threshold level to produce first bi-level image data for bump pedestal measurements;

converting the image data by thresholding using a second threshold level to produce second bi-level image data for bump head measurements;

processing said first bi-level image data to determine at least one pedestal dimension of said bump pedestal;

processing said second bi-level image data to determine at least one head dimension of said bump head; and determining whether the at least one pedestal dimension and the at least one head dimension are within respectively set value ranges and indicating the stud bump is defective when the determination is negative.

13. The method according to claim 12 further comprising:

determining whether the measured value of the at least one head dimension is zero;

successively altering said second threshold level and effecting said processing of said second bi-level image data until one of a non-zero value is obtained for said at least one head dimension and a predetermined number of alterations of said second threshold level occurs;

using said non-zero value in said determination step when obtained; and indicating the stud bump is deemed to be defective when said predetermined number of alterations occurs.

14. The method according to claim 13 further comprising:

processing said first bi-level image data to determine a center of gravity of said bump pedestal;

processing said second bi-level image data to determine a center of gravity of said bump head;

determining an amount of offset of said center of gravity of said bump head from said center of gravity of said bump pedestal; and determining whether the amount of offset is within an allowed range and indicating the stud bump is defective upon a negative determination with respect to the allowed range.

15. The method according to claim 13 further comprising:

processing said second bi-level image data to determine a circumscribed diameter corresponding to a length of a side of a rectangle circumscribing said bump pedestal and a central diameter corresponding to an external dimension on a center-line of said bump pedestal;

determining a difference between the circumscribed diameter and the central diameter; and determining whether the difference is within an allowed range and indicating the stud bump is defective upon a negative determination with respect to the allowed range.

16. A method of inspecting a stud bump having a bump pedestal and a bump head, comprising the steps of:

imaging an external appearance of the stud bump to produce image data;

converting the image data by thresholding using at least one threshold level to produce bi-level image data;

processing said bi-level image data to determine at least one pedestal dimension of said bump pedestal and at least one head dimension of said bump head;

determining whether the measured value of the at least one head dimension is zero;

successively altering said at least one threshold level and effecting said processing of said bi-level image data until one of a non-zero value is obtained for said at least one head dimension and a predetermined number of alterations of said second threshold level occurs;

indicating the stud bump is deemed to be defective when said predetermined number of alterations occurs; and determining whether the at least one pedestal dimension and the at least one head dimension, when obtained, are within respectively set value ranges and indicating the stud bump is defective when the determination is negative.

17. The method of claim 16 wherein:

said at least one threshold level includes a first threshold level used for thresholding said image data to produce bi-level data for evaluating said bump pedestal and a second threshold level used for thresholding said image data to produce bi-level data for evaluating said bump head; and said step of successively altering alters said second threshold level.

18. A method of inspecting a stud bump having a bump pedestal and a bump head, comprising the steps of:

imaging an external appearance of the stud bump to produce image data;

converting the image data by thresholding using at least one threshold level to produce bi-level image data;

processing said bi-level image data to determine at least one pedestal dimension of said bump pedestal and at least one head dimension of said bump head;

processing said bi-level image data to determine a center of gravity of said bump pedestal;

processing said bi-level image data to determine a center of gravity of said bump head;

determining an amount of offset of said center of gravity of said bump head from said center of gravity of said bump pedestal;

determining whether the amount of offset is within an allowed range and indicating the stud bump is defective upon a negative determination with respect to the allowed range; and determining whether the at least one pedestal dimension and the at least one head dimension are within respectively set value ranges and indicating the stud bump is defective when the determination is negative.

19. A method of inspecting a stud bump having a bump pedestal and a bump head, comprising the steps of:

imaging an external appearance of the stud bump to produce image data;

converting the image data by thresholding using at least one threshold level to produce bi-level image data;

processing said bi-level image data to determine at least one pedestal dimension of said bump pedestal and at least one head dimension of said bump head;

processing said bi-level image data to determine a circumscribed diameter corresponding to a length of a side of a rectangle circumscribing said bump pedestal and a central diameter corresponding to an external dimension on a centerline of said bump pedestal;

determining a difference between the circumscribed diameter and the central diameter;

determining whether the difference is within an allowed range and indicating the stud bump is defective upon a negative determination with respect to the allowed range; and determining whether the at least one pedestal dimension and the at least one head dimension are within respectively set value ranges and indicating the stud bump is defective when the determination is negative.

* * * * *